US008923452B2

(12) United States Patent
Johnson

(10) Patent No.: US 8,923,452 B2
(45) Date of Patent: Dec. 30, 2014

(54) NOISE-BASED GAIN ADJUSTMENT AND AMPLITUDE ESTIMATION SYSTEM

(71) Applicant: Lockheed Martin Corporation, Bethesda, MD (US)

(72) Inventor: James A. Johnson, Owego, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 13/845,772

(22) Filed: Mar. 18, 2013

(65) Prior Publication Data

US 2014/0270007 A1     Sep. 18, 2014

(51) Int. Cl.
*H04L 27/08*     (2006.01)
*H03G 3/20*     (2006.01)

(52) U.S. Cl.
CPC ........................................ *H03G 3/20* (2013.01)
USPC .......................................... 375/345; 375/316

(58) Field of Classification Search
USPC .......................................................... 375/345
See application file for complete search history.

(56) References Cited

U.S. PATENT DOCUMENTS

| | | | | |
|---|---|---|---|---|
| 4,527,162 | A * | 7/1985 | Strickland | 342/351 |
| 2008/0062888 | A1* | 3/2008 | Lusky et al. | 370/252 |
| 2008/0108397 | A1* | 5/2008 | Piipponen et al. | 455/574 |
| 2011/0243038 | A1* | 10/2011 | Challa et al. | 370/280 |

OTHER PUBLICATIONS

"Receiver Sensitivity Noise", http://www.phys.hawaii.edu/~anita/new/papers/militaryHandbook/rcvr_sen.pdf, pp. 5-2.1 to 5-2.9.
Farina, A., "Introduction to Radar Signal & Data Processing: The Opportunity", Nato Otan, RTP-EN-SET-063, pp. 1-1 to 1-22, Sep. 1, 2006.
Richards, Mark A., "Introduction to Radar Systems", Fundamentals of Radar Signal Processing, Chapter 1, McGraw-Hill, New York, 2005, 52 pages; http://users.ece.gatech.edu~mrichard/FundRadarSigProc.htm.
Shoghi, Payam et al., "Experimental Results for a Successive Detection Log Video Amplifier in a Single-Chip Frequency Synthesized Radio Frequency Spectrum Analyzer" published in IEEE SoutheastCon 2009, Mar. 5-8, 2009, Atlanta, GA, 4 pages.
"Designing Antenna Systems for Maximum Sensitivity", posted by Richard Kuehnel, Communications Link Quality, http://www.aktuelilum.com/circuits/receiving/, 8 pages, 2012.
"Basic Log Amp Concepts and Terminology", MT-077. Log Amp Basics, Analog Devices, http://www.analog.com/static/imported-files/tutorials/MT-077.pdf., 6 pages, 2009.
DVLA's Solid State Components, Definitions and a Glossary of Terms for Detector Logarithmic Video Amplifiers and Related Products, http://americanmicrowavecorp.com/oldsite/sform/appnotes3/glossary.html, 6 pages, 2003.

* cited by examiner

*Primary Examiner* — Erin File
(74) *Attorney, Agent, or Firm* — Miles & Stockbridge P.C.; James T. Carmichael

(57) ABSTRACT

Methods and systems for amplitude estimation and gain adjustment using noise as a reference are described. An example receiver can include an antenna and a front end amplifier coupled to the antenna. The receiver can also include a detector circuit coupled to the front end amplifier. The receiver can be configured to determine a power of a received signal at the antenna based on a gain of the receiver. The gain of the receiver can be determined based on a noise figure of the front end amplifier and a noise amplitude.

9 Claims, 3 Drawing Sheets

NOISE-BASED GAIN ADJUSTMENT AND AMPLITUDE ESTIMATION SYSTEM

Embodiments relate generally to radio receivers, and more particularly, to methods and systems for signal amplitude estimation and system gain adjustment using noise as a reference.

Some receivers may estimate absolute signal amplitude based on an assumption that for a given configuration (e.g., operating settings), system gain would be constant from system to system. And although variation in gain is known to exist, a nominal gain value is often chosen. Deviations from the nominal value can result in errors when estimating absolute signal amplitude.

Embodiments were conceived in light of the above-mentioned problems and limitations, among other things.

Some embodiments can include a receiver having an antenna, a front end amplifier coupled to the antenna, and a detector circuit coupled to the front end amplifier. The receiver can be configured to measure signal amplitude at the detector, which can be used to infer received signal amplitude at the antenna based on a gain of the receiver system, based on the following formula:

$$P_D = P_S + G_1 + G_2$$

where $P_D$ is the measured signal amplitude at the detector, $P_S$ is the signal amplitude at the antenna, $G_1$ is the gain of the antenna and any circuitry up to but not including the front end amplifier and may be known or can be determined by well known techniques, $G_2$ is the gain of the front end amplifier and subsequent circuitry up to the point of measurement. $G_2$ may not be precisely known, but can be determined as described below.

The receiver can include a programmable attenuator configured to adjust system gain level, $G_2$. The system gain level can be selected so as to set observed noise to a predetermined level.

The receiver gain, $G_2$, can be determined by measuring noise amplitude at the detector in the absence of an input signal based on the formula:

$$P_N = G_2 + NF + 10\log_{10}(k) + 10\log_{10}(T) + 10\log_{10}(B)$$

where $P_N$ is measured noise amplitude at the detector, NF is a system noise figure, k is Boltzmann's constant, T is absolute temperature and B is bandwidth.

The receiver can include a plurality of physical channels. Each channel can also include one or more corresponding programmable attenuators. The receiver can also include a max hold circuit configured to generate a biased estimation of noise power.

Some embodiments can include a method comprising providing a noise estimation for a front end of a receiver, and placing the receiver into noise mode. The method can also include measuring a noise amplitude at a detector subsequent to the receiver front end, and determining a system gain based on the front end noise estimation and the noise amplitude.

The method can further include placing the receiver into a normal receive mode, and receiving a signal at an antenna. The method can include determining a power level of the signal at the detector, and determining an estimated power level of the signal at the antenna based on the system gain.

The method can include estimating a distance of the antenna to a transmitter of the signal based on the estimated power level of the signal at the antenna. The absolute amplitude of the signal can be estimated based on a comparison of the signal amplitude at the detector and estimate of the system gains, $G_1$ and $G_2$.

The method can also include comprising adjusting the system gain to maximize instantaneous dynamic range. The method can further include injecting a high-level signal into the receiver so as to saturate the receiver, and include estimating a maximum absolute signal level able to be processed by the receiver.

The method can further include estimating a minimum absolute signal level able to be processed by the receiver based on the noise amplitude.

The method can include comprising removing bias from the noise amplitude measurement based on receiver behavior parameters including one or more of integration time of a max hold circuit, IF bandwidth and video bandwidth. The method can also include setting a programmable thresholding circuit to achieve a predetermined false alarm probability.

Some embodiments can include a system having an antenna and a front end amplifier coupled to the antenna via a cable. The system can also include a detector circuit coupled to the front end amplifier and a programmable attenuator configured to set a system gain level.

The system can be configured to determine a power of a received signal at the antenna based on the system gain level. The system gain level can be determined based on a noise amplitude of the system. Also, the system gain level can be selected so as to set observed noise to a predetermined level.

The receiver can be configured to measure signal amplitude at the detector, which can be used to infer received signal amplitude at the antenna based on a gain of the receiver system, based on the following formula:

$$P_D = P_S + G_1 + G_2$$

where $P_D$ is the measured signal amplitude at the detector, $P_S$ is the signal amplitude at the antenna, $G_1$ is the gain of the antenna and any circuitry up to but not including the front end amplifier, $G_2$ is the gain of the front end amplifier and subsequent circuitry up to the point of measurement. $G_1$ and $G_2$ may not be precisely known.

The receiver can include a programmable attenuator configured to adjust system gain level, $G_2$. The system gain level can be selected so as to set observed noise to a predetermined level.

The receiver gain, $G_2$, can be determined by measuring noise amplitude at the detector in the absence of an input signal based on the formula:

$$P_N = G_2 + NF + 10\log_{10}(k) + 10\log_{10}(T) + 10\log_{10}(B)$$

where $P_N$ is measured noise amplitude at the detector, NF is a system noise figure, k is Boltzmann's constant, T is absolute temperature and B is bandwidth.

The system can also include a plurality of physical channels each having at least one corresponding programmable attenuator. The system can further include a max hold circuit configured to generate a biased estimation of noise power. The system can also include a programmable thresholding circuit configured to be set so as to achieve a predetermined false alarm probability.

DETAILED DESCRIPTION

In general, the gain of a receiver can be determined based on noise in the receiver system. The gain can then be used to estimate received signal power at an antenna. Such signal power estimate can be useful for estimating the distance from a transmitter having a known power to a receiver. This kind of estimation may be useful in radar warning receivers, electronic surveillance measures and the like. Embodiments may also be configured for use in audio applications.

Figure 1:
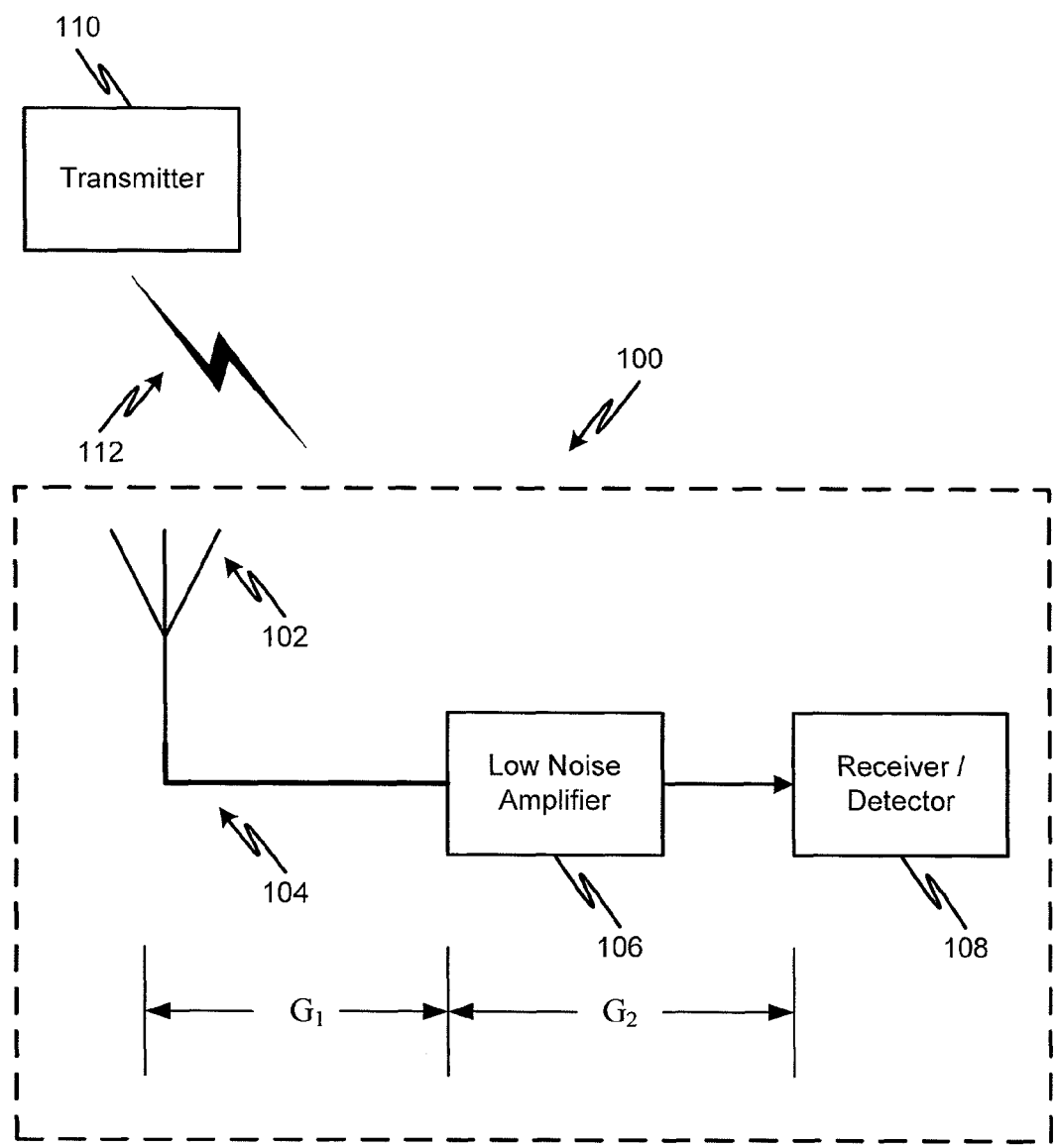
FIG. 1 is a diagram of an example receiver system in accordance with at least one embodiment.

FIG. 1 is a diagram of an example multi-channel receiver system 100. The receiver system 100 includes one or more antennas 102, cabling 104 to connect each antenna 102 to a front-end amplifier (e.g., a low noise amplifier). The receiver 100 system also includes a receiver/detector circuit 108 coupled to the low noise amplifier 106. FIG. 1 also shows the sections of the system having gains $G_1$ and $G_2$.

In operation, the receiver 100 enters a calibration mode (or noise mode) and determines a system noise factor for the front-end. The noise factor can be based on a theoretical formula or captured and analyzed data. Once the noise factor is determined, the receiver 100 can enter a "live" mode. Once in the "live" mode, the receiver 100 can use a fixed- or variable-level threshold detector (not shown) to identify a signal above noise level.

A transmitter 110 may be at an unknown location and may have a known or estimated transmit power. The transmitter 110 can transmit a signal 112. The receiver system 100 can receive the signal 112 via antenna 102. The receiver system 100 can then use an estimate of the received signal 112 power to determine an estimated location (or distance away from the receiver 100) of the transmitter 110. The process of determining system noise is described below in connection with FIG. 2.

In some embodiments, the gain can be manually and/or automatically recomputed as described herein, in response to a change in a system configuration parameter such as gain, bandwidth, frequency tuning and/or the like.

Figure 2:
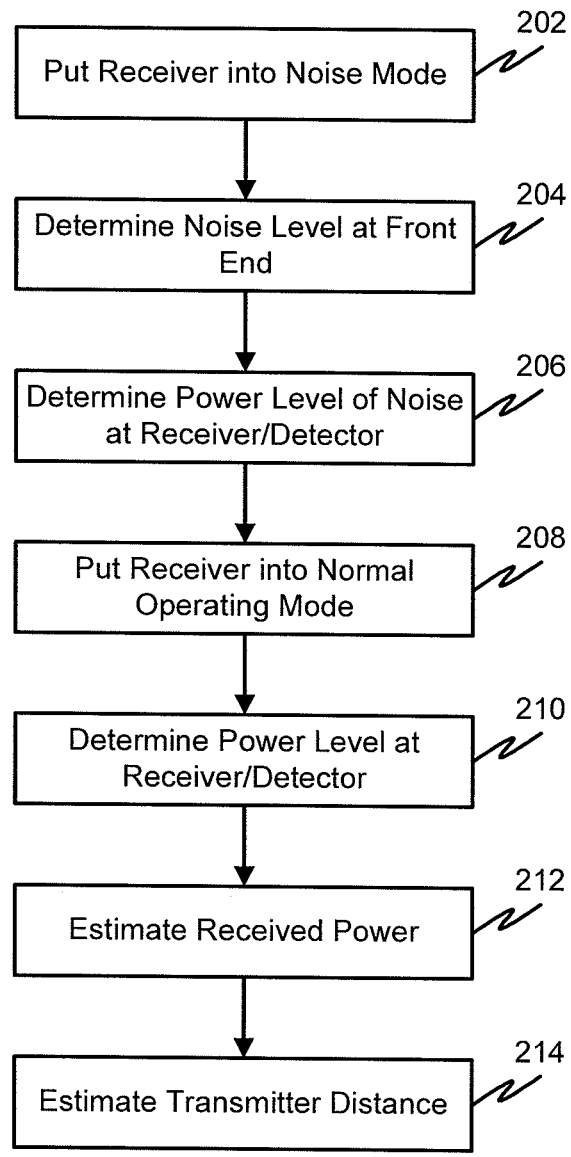
FIG. 2 is a flowchart of an example method for amplitude estimation and gain adjustment using noise as a reference in accordance with at least one embodiment.

FIG. 2 is a flowchart of an example method for amplitude estimation and gain adjustment using noise as a reference in accordance with at least one embodiment. Processing begins at 202, where a receiver is put into noise mode. Noise mode can include switching off an antenna so that a receiver is receiving essentially a noise signal generated by the circuitry. Processing continues to 204.

At 204, a noise level (or amplitude) for the receiver front end is determined. The noise level of the front end can be based on a theoretical estimate such as N=kTB, where N equals noise, k is Boltzmann's constant, T is absolute temperature and B is bandwidth. The noise level from the front end can also be provided, at least in part, by factory data. Processing continues to 206.

At 206, a power level (or amplitude) of the system noise signal is measured at the receiver/detector (e.g., 108). The receiver can include a programmable attenuator configured to adjust system gain level, $G_2$. The system gain level can be selected so as to set observed noise to a predetermined level. The receiver gain, $G_2$, can be determined by measuring noise amplitude at the detector in the absence of an input signal based on the formula:

$$P_N = G_2 + NF + 10\log_{10}(k) + 10\log_{10}(T) + 10\log_{10}(B)$$

where $P_N$ is measured noise amplitude at the detector, NF is a system noise figure, k is Boltzmann's constant, T is absolute temperature and B is bandwidth. Processing continues to 208.

At 208, the receiver is placed into operating mode (e.g., the antenna is opened up). Processing continues to 210.

At 210, a power level (or signal amplitude) is determined at the receiver/detector. Processing continues to 212.

At 212, the power or amplitude of the signal received at the antenna is estimated using the gain computed in 206, which includes terms for noise and bandwidth. Processing continues to 214.

Regarding steps 210 and 212, as discussed above, the receiver can be configured to measure signal amplitude at the detector, which can be used to infer received signal amplitude at the antenna based on a gain of the receiver system, based on the following formula:

$$P_D = P_S + G_1 + G_2$$

where $P_D$ is the measured signal amplitude at the detector, $P_S$ is the signal amplitude at the antenna, $G_1$ is the gain of the antenna and any circuitry up to but not including the front end amplifier, $G_2$ is the gain of the front end amplifier and subsequent circuitry up to the point of measurement. $G_1$ and $G_2$ may not be precisely known.

At 214, the distance from the receiver antenna to a transmitter is estimated based on the received power.

It will be appreciated that 202-214 may be repeated in whole or in part in order to accomplish a contemplated amplitude estimation and/or gain adjustment task using noise as a reference.

Figure 3:
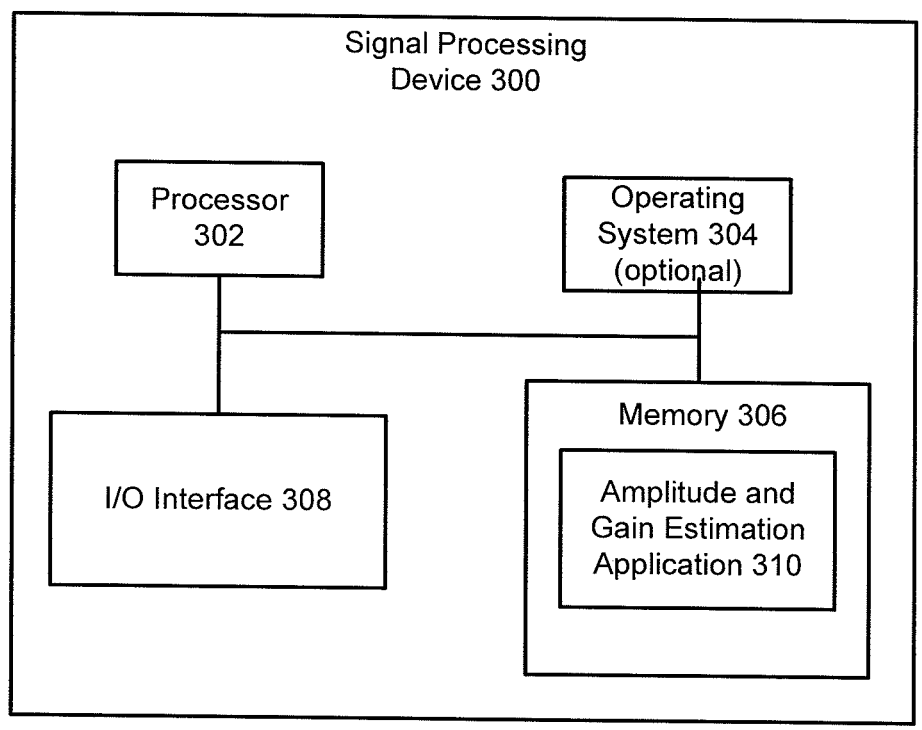
FIG. 3 is a diagram of an example signal processing system in accordance with at least one embodiment.

FIG. 3 is an example signal processing system 300 in accordance with at least one embodiment. The signal processing system 300 includes a processor 302, operating system 304 (optional), memory 306 and I/O interface 308. The memory 306 can include an amplitude and gain estimation application 310.

In operation, the processor 302 may execute the application 310 stored in the memory 306. The application 310 can include software instructions that, when executed by the processor, cause the processor to perform operations for signal processing in accordance with the present disclosure (e.g., performing one or more of steps 202-214 described above).

The application program 312 can operate in conjunction with the operating system 304.

It will be appreciated that the modules, processes, systems, and sections described above can be implemented in hardware, hardware programmed by software, software instructions stored on a nontransitory computer readable medium or a combination of the above. A system as described above, for example, can include a processor configured to execute a sequence of programmed instructions stored on a nontransitory computer readable medium. For example, the processor can include, but not be limited to, a signal processor, a programmable receiver, a personal computer or workstation or other such computing system that includes a processor, microprocessor, microcontroller device, or is comprised of control logic including integrated circuits such as, for example, an Application Specific Integrated Circuit (ASIC). The instructions can be compiled from source code instructions provided in accordance with a programming language such as Java, C, C++, C#.net, assembly or the like. The instructions can also comprise code and data objects provided in accordance with, for example, the Visual Basic™ language, or another structured or object-oriented programming language. The sequence of programmed instructions, or programmable logic device configuration software, and data associated therewith can be stored in a nontransitory computer-readable medium such as a computer memory or storage device which may be any suitable memory apparatus, such as, but not limited to ROM, PROM, EEPROM, RAM, flash memory, disk drive and the like.

Furthermore, the modules, processes systems, and sections can be implemented as a single processor or as a distributed processor. Further, it should be appreciated that the steps mentioned above may be performed on a single or distributed processor (single and/or multi-core, or cloud computing system). Also, the processes, system components, modules, and sub-modules described in the various figures of and for embodiments above may be distributed across multiple computers or systems or may be co-located in a single processor or system. Example structural embodiment alternatives suitable for implementing the modules, sections, systems, means, or processes described herein are provided below.

The modules, processors or systems described above can be implemented as a programmed general purpose computer, an electronic device programmed with microcode, a hardwired analog logic circuit, software stored on a computer-readable medium or signal, an optical computing device, a networked system of electronic and/or optical devices, a special purpose computing device, an integrated circuit device, a semiconductor chip, and/or a software module or object stored on a computer-readable medium or signal, for example.

Embodiments of the method and system (or their subcomponents or modules), may be implemented on a general-purpose computer, a special-purpose computer, a programmed microprocessor or microcontroller and peripheral integrated circuit element, an ASIC or other integrated circuit, a digital signal processor, a hardwired electronic or logic circuit such as a discrete element circuit, a programmed logic circuit such as a PLD, PLA, FPGA, PAL, or the like. In general, any processor capable of implementing the functions or steps described herein can be used to implement embodiments of the method, system, or a computer program product (software program stored on a nontransitory computer readable medium).

Furthermore, embodiments of the disclosed method, system, and computer program product (or software instructions stored on a nontransitory computer readable medium) may be readily implemented, fully or partially, in software using, for example, object or object-oriented software development environments that provide portable source code that can be used on a variety of computer platforms. Alternatively, embodiments of the disclosed method, system, and computer program product can be implemented partially or fully in hardware using, for example, standard logic circuits or a VLSI design. Other hardware or software can be used to implement embodiments depending on the speed and/or efficiency requirements of the systems, the particular function, and/or particular software or hardware system, microprocessor, or microcomputer being utilized. Embodiments of the method, system, and computer program product can be implemented in hardware and/or software using any known or later developed systems or structures, devices and/or software by those of ordinary skill in the applicable art from the function description provided herein and with a general basic knowledge of the electrical engineering and signal processing arts.

Moreover, embodiments of the disclosed method, system, and computer readable media (or computer program product) can be implemented in software executed on a programmed general purpose computer, a special purpose computer, a microprocessor, or the like.

It is, therefore, apparent that there is provided, in accordance with the various embodiments disclosed herein, methods, systems and computer readable media for amplitude estimation and gain adjustment using noise as a reference.

While the disclosed subject matter has been described in conjunction with a number of embodiments, it is evident that many alternatives, modifications and variations would be, or are, apparent to those of ordinary skill in the applicable arts. Accordingly, Applicant intends to embrace all such alternatives, modifications, equivalents and variations that are within the spirit and scope of the disclosed subject matter.

What is claimed is:

1. A receiver comprising:
an antenna;
a front end amplifier coupled to the antenna; and
a detector circuit coupled to the front end amplifier,
wherein the receiver is configured to determine a power of a received signal at the antenna based on a gain of the receiver,
wherein the gain of the receiver ($G_2$) is determined based on a noise figure of the front end amplifier, and
wherein the gain of the receiver, $G_2$, is determined by measuring noise amplitude at the detector in an absence of an input signal based on the following formula:

$$P_N = G_2 + NF + 10\log_{10}(k) + 10\log_{10}(T) + 10\log_{10}(B)$$

where $P_N$ is measured noise amplitude at the detector, NF is a system noise figure, k is Boltzmann's constant, T is absolute temperature and B is bandwidth.

2. A method comprising:
providing a noise estimation for a front end of a receiver;
placing the receiver into noise mode;
measuring a noise amplitude at a detector subsequent to the receiver front end;
determining a system gain based on the front end noise estimation and the noise amplitude;
placing the receiver into a normal receive mode;
receiving a signal at an antenna;
determining a power level of the signal at the detector;
determining an estimated power level of the signal at the antenna based on the system gain; and
estimating a distance of the antenna to a transmitter of the signal based on the estimated power level of the signal.

3. The method of claim 2, wherein an absolute amplitude of the signal is estimated based on a comparison of the signal amplitude at the detector and an estimated receiver gain.

4. The method of claim 2, further comprising adjusting the system gain to maximize instantaneous dynamic range.

5. The method of claim 2, further comprising:
injecting a high-level signal into the receiver so as to saturate the receiver; and
estimating a maximum absolute signal level able to be processed.

6. The method of claim 2, further comprising estimating a minimum absolute signal level able to be processed by the receiver based on the noise amplitude.

7. The method of claim 2, further comprising removing bias from the noise amplitude measurement based on receiver behavior parameters including one or more of integration time of a max hold circuit, IF bandwidth and video bandwidth.

8. The method of claim 2, further comprising setting a programmable thresholding circuit to achieve a predetermined false alarm probability.

9. A system comprising:
an antenna;
a front end amplifier coupled to the antenna via a cable;

a detector circuit coupled to the front end amplifier; and a programmable attenuator configured to set a system gain level, wherein the system is configured to determine a power of a received signal at the antenna based on the system gain level, wherein the system gain level is determined based on a noise amplitude of the system, and wherein the system gain level, $G_2$, is determined by measuring noise amplitude at the detector in an absence of an input signal based on the following formula:

$$P_N = G_2 + NF + 10\log_{10}(k) + 10\log_{10}(T) + 10\log_{10}(B)$$

where $P_N$ is measured noise amplitude at the detector, NF is a system noise figure, k is Boltzmann's constant, T is absolute temperature and B is bandwidth.

* * * * *